United States Patent
Merritt

(10) Patent No.: US 6,353,549 B1
(45) Date of Patent: *Mar. 5, 2002

(54) ARCHITECTURE AND PACKAGE ORIENTATION FOR HIGH SPEED MEMORY DEVICES

(75) Inventor: Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/492,412

(22) Filed: Jan. 27, 2000

Related U.S. Application Data

(60) Continuation of application No. 09/146,262, filed on Sep. 3, 1998, now Pat. No. 6,043,107, which is a division of application No. 08/892,607, filed on Jul. 14, 1997, now Pat. No. 5,880,987.

(51) Int. Cl.$^7$ ............................................. G11C 5/06
(52) U.S. Cl. ........................... 365/51; 365/63; 257/678
(58) Field of Search ..................... 365/51, 63, 230.03; 257/678, 684, 723

(56) References Cited

U.S. PATENT DOCUMENTS 6,043,107 A  *  3/2000 Merritt ........................ 438/106

* cited by examiner

*Primary Examiner*—Huan Hoang
(74) *Attorney, Agent, or Firm*—Schwegman, Lundberg, Woessner & Kluth, P.A.

(57) ABSTRACT

A memory chip containing a dual bank memory system is arranged to be mounted cross-wise in its package with the major axis of the memory chip extending along the minor axis of the package. The data output register and the chip bond pads are located between the two memory banks so that the data read/write lines extend only through a portion of the memory chip to the data output register. All of the address chip bond pads are located in one row and all of the data chip bond pads are located in another row that extends in parallel with the row of address chip bond pads. Also, the column decoder circuit for each memory bank is located at the center of the memory bank. This allows the column select lines to be segmented into two groups, with one group of column select lines extending from the center of the memory array outwardly toward one side of the memory array and with the other group of column select lines extending from the center of the memory array outwardly toward opposite side of the memory array. The memory architecture and layout provided by the invention reduces the length of the data read/write lines and the column select lines, with an attendant reduction in the RC time constant, allowing reduction in the memory access times.

13 Claims, 5 Drawing Sheets

US 6,353,549 B1

ARCHITECTURE AND PACKAGE ORIENTATION FOR HIGH SPEED MEMORY DEVICES

This application is a Continuation of U.S. Ser. No. 09/146,262 filed Sep. 3, 1998 now U.S. Pat. No. 6,043,107, which is a Divisional of U.S. Ser. No. 08/892,607, filed Jul. 14, 1997, now abandoned, U.S. Pat. No. 5,880,987, issued Mar. 9, 1999.

FIELD OF THE INVENTION

The present invention relates to semiconductor memory devices, and in particular, the invention relates to an architecture and package orientation for semiconductor memory devices.

BACKGROUND OF THE INVENTION

Various arrangements have been proposed for increasing the speed of memory devices requiring high speed data throughput such as synchronous dynamic random access memory (SDRAM). Most of these arrangements have been directed to minimizing the access time for accessing the memory array. These arrangements include development of faster operating modes, such as extended data output mode, burst write and read modes, etc., and the use of pipelining arrangements. At the present time for example, the standard high Speed for known SDRAM devices is about 100 MHZ.

Although many exsisting memory devices provide fast operation, the extent to which speed can be increased is limited by the architecture and packaging of the memory device. For example, SDRAM devices are housed in packages that have an industry-standard pin layout and are of specified lengths and widths. Typically, SDRAM devices are contained in small outline-J lead (SOJ) packages. For a dual 1 Meg×4 SDRAM device, the width of the SOJ package is about 300 mils and the width of the thin, small outline package (TSOP) is about 400 mils. To make the chip on which the memory device is fabricated fit in such standard package, semiconductor manufactures orient the chip lengthwise within the package.

FIG. 1, which is labeled Prior Art, is a representation of the chip layout for a known dual bank SDRAM device 100 fabricated on a memory chip 102. The SDRAM device includes a bank 0 memory array 104 which extends along one side of the memory chip and a bank 1 memory array 106 which extends along the opposite side of the memory chip. Each memory array, such as memory array 104, includes a plurality of sub-arrays 105 having access circuitry including row decoder circuits, column decoder circuits and sense amplifier circuits. The row decoder circuits include row decoder circuits 107 which extend along the side 108 of the memory sub-arrays, row decoder circuits 109 which extend along the opposite side 110 of the sub-arrays, and row decoder circuits 111 which are located between the sub-arrays. The column decoder circuits 112 extend along one end 114 of the memory array near the one edge 116 of the memory chip 102. The sense amplifier circuits 118 are located between each of the sub-arrays of the memory array. Column select lines, such as column select lines 120 represented by dashed lines, extend through the memory array 104 om the column decoder circuits 112 at end 114 of the memory array 104 near edge 116 of the memory chip to the opposite end 122 of the memory array near the opposite edge 124 of the memory chip.

The data output register 128 is located adjacent to the edge 124 of the memory chip so as to be adjacent to the chip bond pads as is conventional. The memory chip includes a first plurality of chip bond pads 130 which are located along edge 116 of the memory chip and which provide connections to address inputs for the memory chip. A second plurality of chip bond pads 132, which are located along the opposite edge 124 of the memory chip, provide connections to data inputs/outputs for the memory chip. The memory further includes clock chip bond pads located along edge 116 of the memory chip, and power chip bond pads located along both edges 116, 124 of the memory chip.

FIG. 2, which is labeled "Prior Art" is a bond drawing for the known SDRAM device shown in FIG. 1 mounted in a package 202. By way of example, the package is a forty-four pin, thin small outline package (TSOP). As is shown in FIG. 2, the memory chip 102 is oriented lengthwise within the package in the conventional manner with the major axis of the memory chip extending along or parallel to the major axis of the package as is illustrated in FIG. 2. The package includes address pins A0–A3, A10 and BA, which extend along one side 204 of the package near one end 206 thereof and address input pins A4–A9 which extend along the opposite side 208 of the package near end 206. The package additionally includes data pins DQ0–DQ3 which extend along side 204 of the package near the opposite end 210 of the package, and data pins DQ4–DQ7 which extend along side 208 of the package near end 210. Also shown in FIG. 2 are the address chip bond pads 130 and the data chip bond pads 132. The address chip bond pads 130 are connected to the address pins A0–A10 and BA of the package in the conventional manner as represented by the dashed lines 212 and brackets. The data chip bond pads 132 are connected to the data pins DQ0–DQ7 in the conventional manner as represented by the dashed lines 214 and brackets. The package includes further pins, such as clock and timing signal input pins CLK, CKE, DQM, RAS*, CAS*, WE* and CS*, that are connected to corresponding clock chip bond pads and power input pins, such as power input pins VCC, VSS, VSSQ and VCCQ, that are connected to corresponding power chip bond pads. To simplify the drawings, only the address chip bond pads 130 and the data chip bond pads 132 are shown connected to the address pins and the data pins, respectively, of the package.

In conventional memory packages, the memory chip is oriented lengthwise within the package, as is illustrated in FIG. 2, so that the address chip bond pads are located adjacent to the address pins A0–A10 near one end 206 of the standard package, with some of the address pins located at one side of the package and the rest of the address pins located at the opposite side of the package. Also, the data chip bond pads are located adjacent to the data pins DQ0–DQ7 near the opposite end 210 of the standard page, with some of the data pins located at one side of the package and the rest of the data pins located at the opposite side of the package.

However, the orientation of the memory chip within the package dictates the locations of the access circuits. In conventional circuits, this requires that different portions of the memory access circuits be located on opposite sides of the chip. Conventionally, for each memory array, the column address circuitry 112 (FIG. 1) is located at one end 114 of the memory array and the data output register 128 is located at the opposite end 116 of the memory array. This layout requires that the column select lines, such as column select lines 120 (FIG. 1), run substantially the entire extent of the memory array from one end 114 to the opposite end 122 thereof, which introduces propagation delay into the data input/output path. Additional propagation delay is introduced by the data read/write lines 134 (FIG. 1) that connect the output of the sense amplifier circuits 118 to the data output register 128 because the data output register is located adjacent to the chip data bond pads 132 and is thus physically spaced apart from the data outputs of the memory arrays. The full length runs that are required for the column select lines and the data read/write lines dictate a high RC (resistor and capacitor) time constant for the column select lines and the data read/write lines which significantly impacts the operating time for the memory access circuits.

For the reasons stated above, and for other reasons which will become apparent to those skilled in the art upon reading and understanding the present specification, there is a need in the art for an improved architecture and package orientation for memory devices that speed up the operation of the memory device.

SUMMARY OF THE INVENTION

The present invention provides an architecture and package orientation for semiconductor memory devices, such as synchronous dynamic random access memory devices, which results in an increase in the operating speed of the memory devices.

In accordance with the invention, the memory chip is mounted in the package with its major axis directed along the minor axis of the package. In one embodiment in which the memory chip includes first and second memory banks or arrays, the data output register and the chip bond pads are located between the two memory arrays. The data read/write lines extend from sub-arrays of the memory array to the data output register. All of the address chip bond pads are located in one row and all of the data chip bond pads are located in another row that extends in parallel with the row of address chip bond pads.

In accordance with another aspect of the invention, the column decoder circuit for each memory array is located at the center of the memory array. This allows the column select lines to be segmented into two groups, with one group of column select lines extending from the center of the memory array outwardly toward one side of the memory array and with the other group of column select lines extending from the center of the memory array outwardly toward an opposite side of the memory array.

The memory architecture and layout provided by the invention reduces the length of the column select lines, with an attendant reduction in the RC (resistor and capacitor) time constant due to the resistance and capacitance of the column select lines so that memory access times can be reduced Moreover, minimizing the length of the data read/write lines reduces the data input/output path and further increases the speed of the memory device.

DESCRIPTION OF THE PREFERRED EMBODIMENT

In the following detailed description of the preferred embodiment, reference is made to the accompanying drawings which form a part hereof, and in which is shown by way of illustration a specific preferred embodiment in which the invention may be practiced. The preferred embodiment is described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 3:
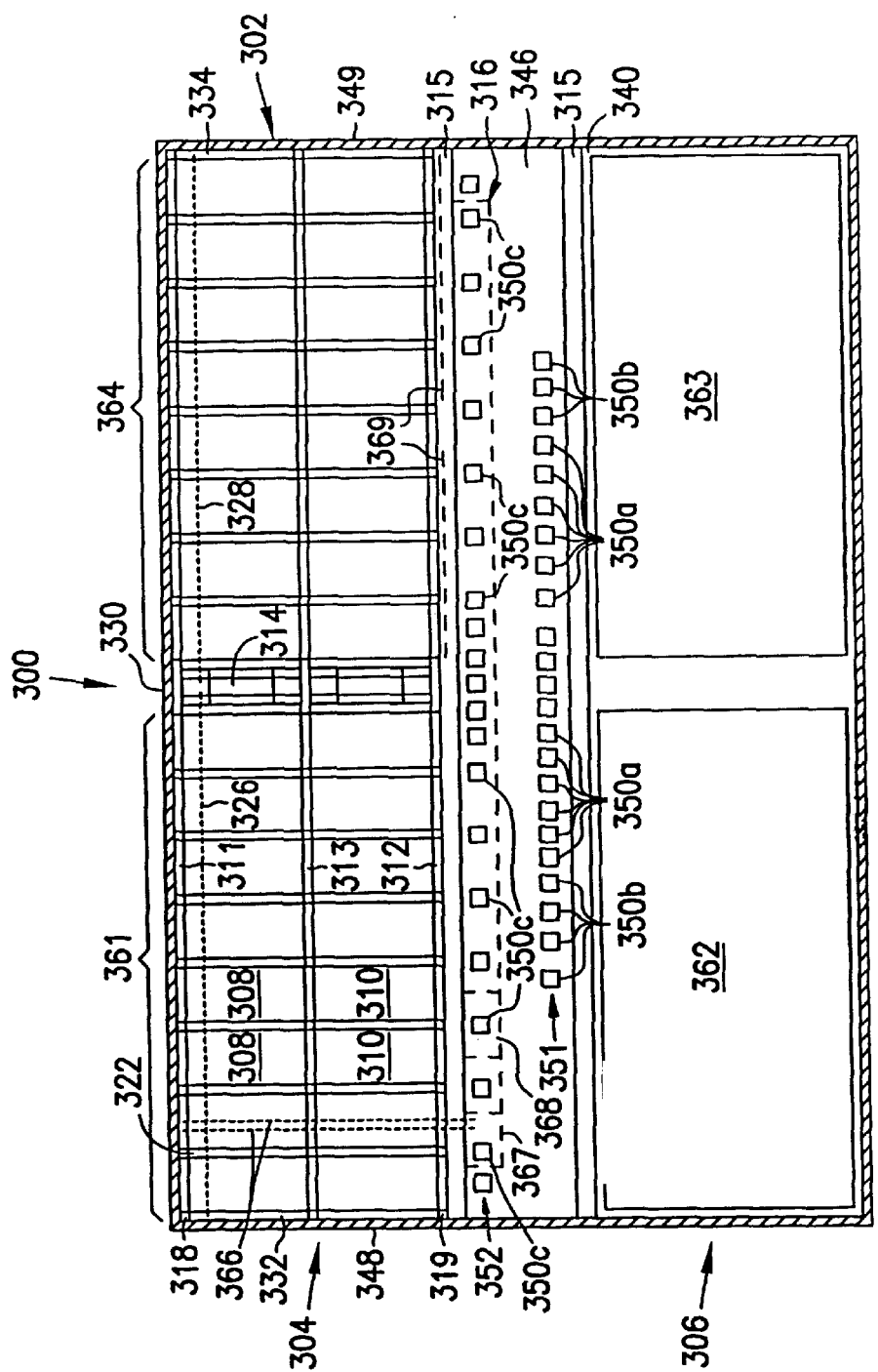
FIG. 3 illustrates the chip layout for a synchronous random access memory device provided by the invention, showing the locations of the memory banks, the row decode and column decode circuits, the helper flip flops, the chip bond pads.

Referring to FIG. 3, there is shown a representation of the architecture for a memory device 300 provided by the invention using a synchronous dynamic random access (SDRAM) memory device as an example. The architecture is equally applicable to other high speed memory devices which require a fast data input/output path, such as extended data out (EDO) memories, dual data rate synchronous dynamic random access memories, "synclink" memories, and RAMBUS memories.

In the example embodiment shown in FIG. 3, the SDRAM device 300 is a dual bank memory fabricated on an memory chip 302. The dual bank memory includes a bank 0 memory array 304 and a bank 1 memory army 306. The memory chip 300 can be produced using conventional integrated circuit processing techniques.

Figure 4:
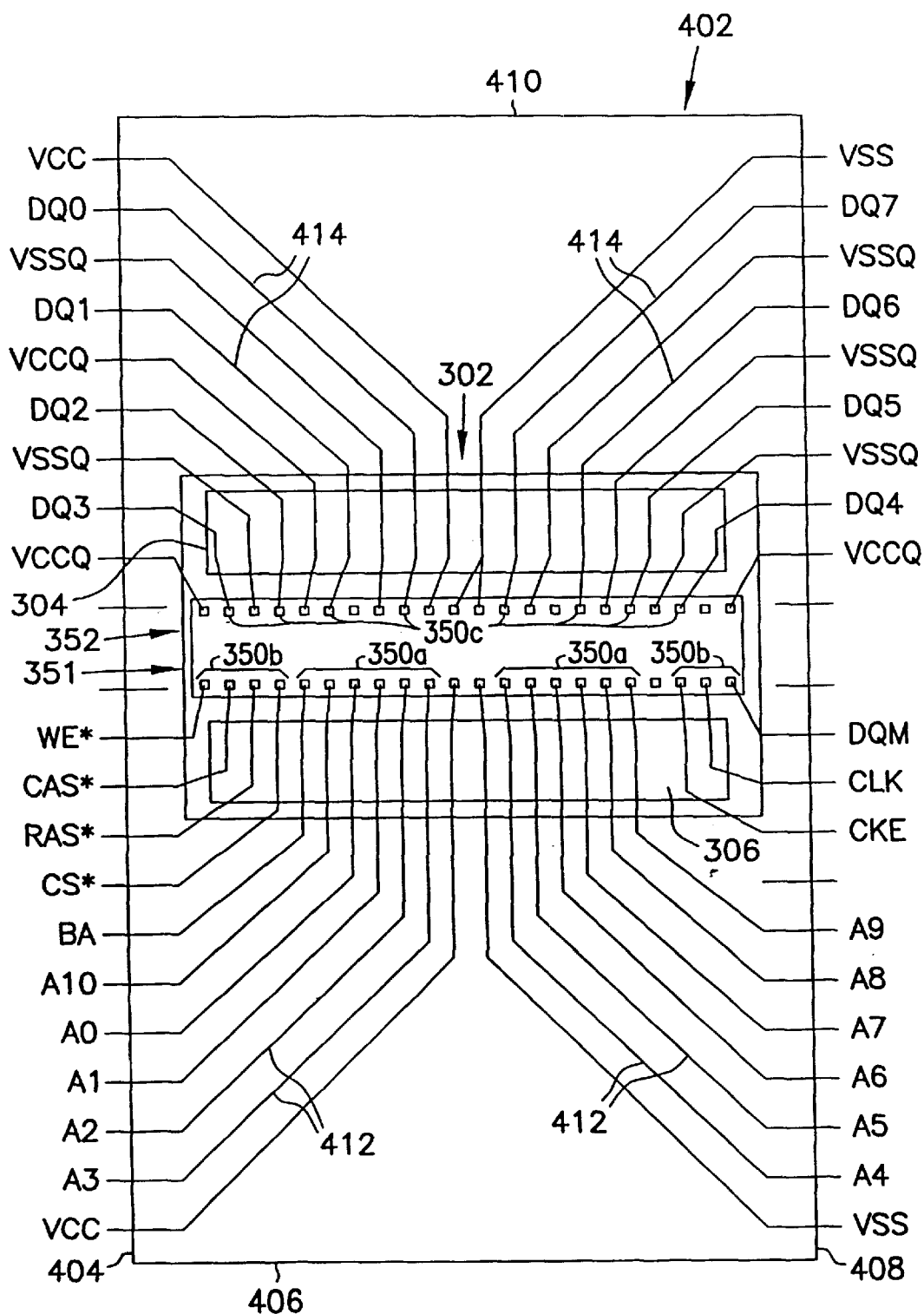
FIG. 4 is a bond drawing for the memory chip shown in FIG. 3.

Referring additionally to FIG. 4, in accordance with the invention, the memory chip 302 is oriented cross-wise in the package 402. Thus, memory array 304 is located at the upper portion of the memory chip 302 as viewed in FIGS. 3 and 4, and memory array 306 is located at the lower portion of the memory chip 302 as viewed in FIGS. 3 and 4.

Referring now to FIG. 3, each memory array, such as memory array 304, includes a plurality of sub-arrays, including a plurality of sub-arrays 308 and a plurality of sub-arrays 310. Each of the memory arrays 304 and 306 of the SDRAM device 300 includes memory access circuitry including row address decoder circuits 311–313, column address decoder circuits 314, helper flip flops and control circuits 315, and a data output register 316. For example, memory array 304 includes row decoder circuits 311, which extend along the upper end 318 of the memory array 304 and are associated with sub-arrays 308, row decoder circuits 312, which extend along the lower end 319 of the memory array 304 and are associated with sub-arrays 310, and row decoder circuits 313 which extend through the memory array 304 located between sub-arrays 308 and 310 are shared by both sub-arrays. The row decoder circuits of memory array 306 are arranged in a similar manner.

Figure 1:
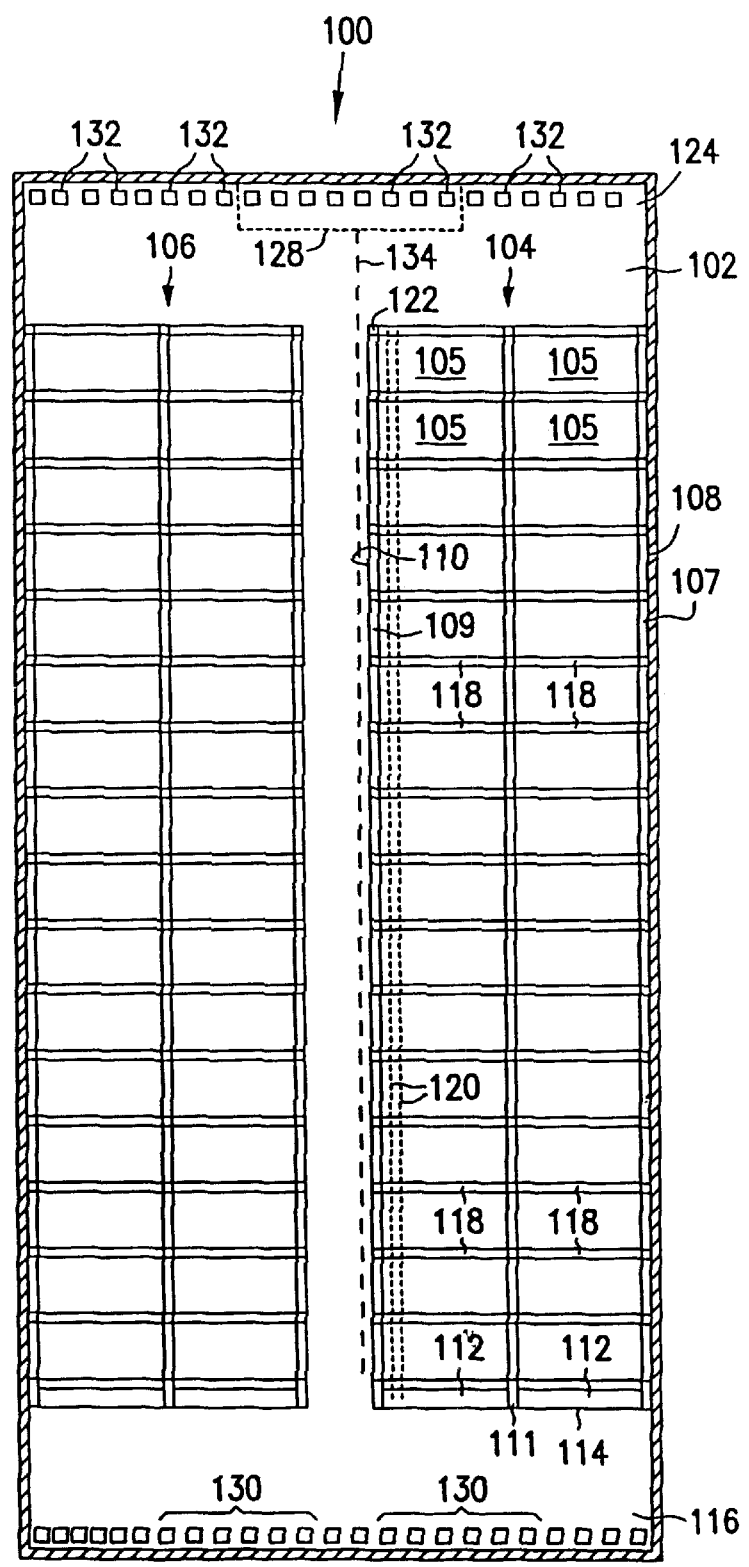
FIG. 1, which is labeled Prior Art, illustrates the chip layout for a known synchronous random access memory device, showing the locations of the memory banks, the row decode and column decode circuits, and the chip bond pads.

In accordance with one aspect of the invention, the column decoder circuits 314 of memory any 304 are located within the memory array 304 and extend between the upper end 318 to the lower end 319 of the memory array 304. The column select lines, such as column select lines represented by dashed lines 326 and 328, are segmented. That is, rather than extending the full length of major axis of the memory array 304, one set of column select lines, including column select line 326, extends through the left portion of the memory array, as viewed in FIG. 3, from the center or middle portion 330 of the memory array 304 to one side 332 of the memory array 304. The second set of the column select lines, including column select line 328, extends through the right portion of the memory array 304 from the middle portion 330 of the array to the opposite side 334 of the memory array 304. The column decoder circuits 314 and the column select lines 326 and 328 for memory array 306 are arranged in a similar fashion Thus, the length of the column select lines of the memory arrays 304 and 306 provided by the invention is approximately one-half the length of column select lines of a conventional memory, such as the one shown in FIG. 1.

The helper flip flops and control circuits 315 associated with memory array 304 are located between the two memory arrays 304 and 306 and extend along the lower end 319 of the memory array 304. Similarly, memory array 306 includes helper flip flops and control circuits 315 which are located between the two memory arrays and which extend along the upper end 340 of the memory array 306.

In accordance with a further aspect of the invention, the chip bond pads 350 for the memory chip 302 are located in the space 346 between the two memory arrays 304 and 306. The memory chip bond pads are arranged in first and second rows which extend parallel to one another between the opposing sides 348 and 349 of the memory chip. One row 351 of chip bond pads is located adjacent to an end of one of the memory arrays, such as the end 340 of memory array 306. The other row 352 of chip bond pads is located adjacent to end 318 of the other memory array 304 and adjacent to the data output register 316.

Referring additionally to FIG. 4, in one embodiment, all of the address chip bond pads 350a, which provide connections to address input pins A0–A10 and BA, are located in the same common row 351 of chip bond pads. Also, all of the clock chip bond pads 350b that provide connections to clock and timing signal inputs WE*, CAS*, RAS*, CS*, DQM, CKE, and CLK for the memory chip are located in the row 351 of chip bond pads. Moreover, all of the data chip bond pads 350c that provide connections to data input/output pins DQ0–DQ7 for the memory chip are located in the same common row 352 of chip bond pads. Both of the rows 351 and 352 of chip bond pads include chip bond pads that provide connection to some of the power input pins VCC, VSSQ, VCCQ and VSS.

The chip orientation in accordance with the invention, allows the data input/output paths to be segmented so that none of the data read/write lines runs a long distance. This, in turn, allows the source of the data that is transferred to the data inputs/outputs DQ0–DQ7 to be segmented. In one embodiment, the sources for the data that is transferred to the data inputs/outputs DQ1 and DQ3 are located in portion 361 of memory array 304 and the sources for data transferred to data inputs/outputs DQ0 and DQ2 are located in portion 362 of memory array 306. The sources for data transferred to data inputs/outputs DQ4 and DQ6 are located in portion 363 of memory array 306 and the sources for data transferred to data inputs/outputs DQ5 and DQ7 are located in portion 364 of memory array 304. The input/output lines 366 extend out of the memory arrays and into the helper flip flops 315. The data read/write lines 369 transfer the data from the helper flip flops 315 to appropriate data output buffers of the data output register 316.

The data output register 316 includes a data output buffer associated with each of the data inputs/outputs DQ0–DQ7, such as data output buffers 367 and 368 which are associated with data inputs/outputs DQ3 and DQ2. Note that the data output buffers are located physically in line with the data read/write lines 369 from the helper flip flops 315 by which the data is transferred to the data output buffers. Also, the helper flip flops 315 are located in line with the input/output lines 366 which transfer data read from the memory array to the helper flip flops. In FIG. 3, the input/output lines 366 are located physically in line with the sub-arrays 308 and 310. An alternate embodiment in which the input/output lines 366 are located physically in line with the sense amplifier circuits 322 will be readily apparent to one skilled in the art. Other embodiments which vary the location of the input/output lines 366 are contemplated and within the scope of the invention.

The architecture for the memory chip provided by the invention is arranged to increase die speed of operation of the memory device 300. For example, the column select lines 326 and 328 are one-half as long as column select lines in a conventional memory because line 326 and 328 extend from the center of the array out toward the sides of the memory array. The data read/write lines 369 as shown in FIG. 3 are approximately one-fourth as long because each extends only one-quarter of the way across the memory array rather than across the entire array in the conventional manner. In an alternate embodiment, additional data read/write lines 369 are added with each line running between a data output bond pad and the sub-arrays 308 and 310 associated with that data output bond pad. In such an alternate embodiment, each data read/write line 369 has a length less than the distance between adjacent data output bond pads. In one embodiment, an SDRAM device having the architecture of shown in FIG. 3 has an operating speed of about 200 MHZ.

Figure 2:
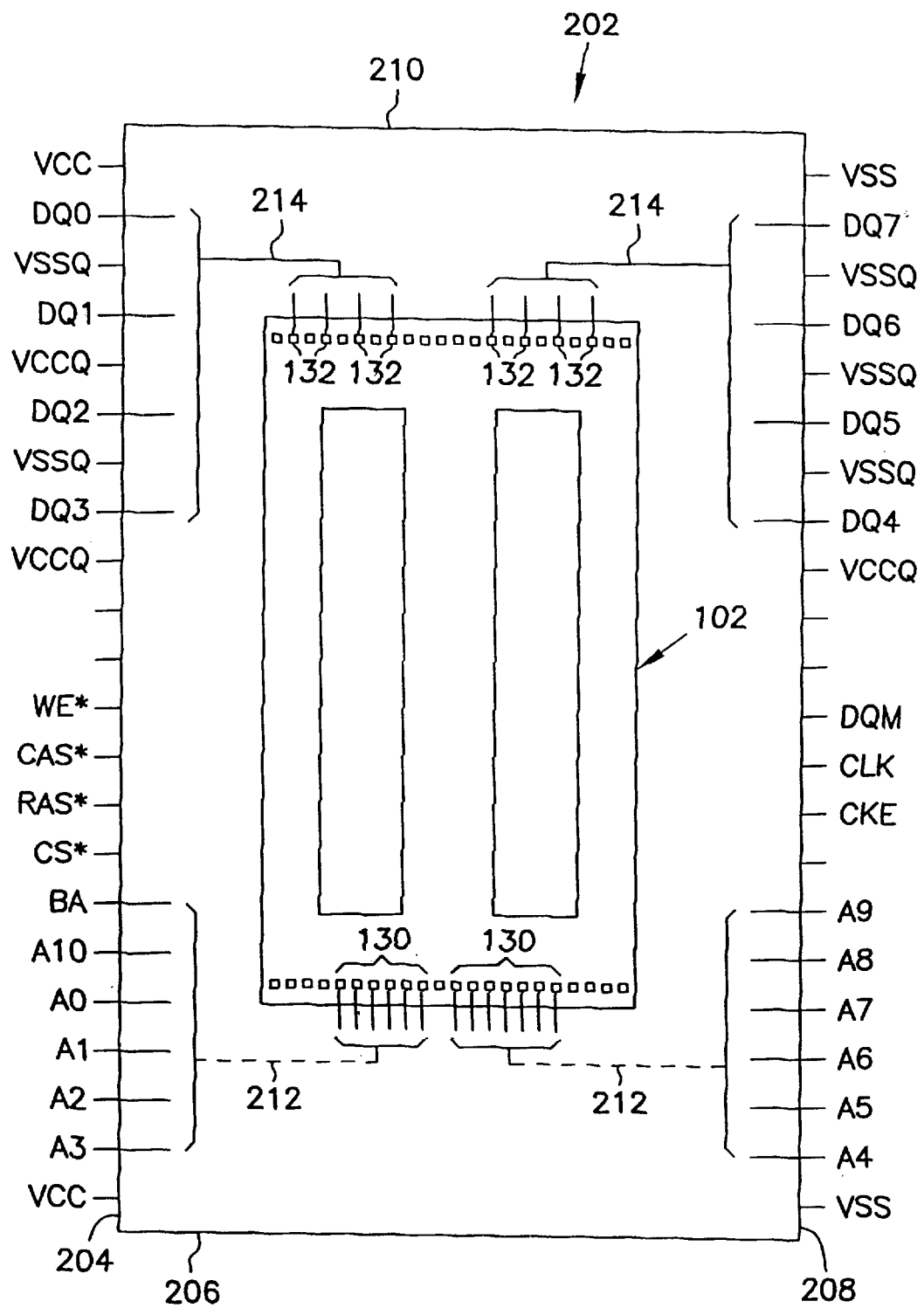
FIG. 2, which is labeled Prior Art, is a bond drawing for the known memory chip shown in FIG. 1.

Referring now to FIG. 4, which is a bond drawing for the example SDRAM device 300 provided by the invention, the memory chip 302 is shown mounted in a package 402. In the example embodiment, the package is a forty-four pin, thin small outline package (TSOP) which corresponds to the package for the prior art SDRAM device that is shown in FIG. 2. However, in contrast to the prior art memory device, the memory chip 302 is oriented lengthwise in the package 402. The pin layout is conventional and corresponds to that for the package 202 shown in FIG. 2. The applicability of the invention to packages with different dimensions will be readily apparent to one skilled in the art.

The width of the thin, small outline package (TSOP) is about 400 mils in width. The width of the chip 302 for the example SDRAM device 300 is approximately 300 mils.

The package 402 includes address input pins A0–A3, A10 and BA, which extend along one side 404 of the package near one end 406 thereof, and address input pins A4–A9, which extend along the opposite side 408 of the package near end 406. The package additionally includes data pins DQ1–DQ3 which extend along side 404 of the package near the opposite end 410 of the package and data pins DQ4–DQ7 which extend along side 408 of the package near end 410. Also shown in FIG. 4 are the address chip bond pads 350a and the data chip bond pads 350c. The address chip bond pads 350a are connected to the address pins A0–A10 and BA of the package by wires 412 in the conventional manner. The data chip bond pads 350c are connected to the data pins DQ0–DQ7 by wires 414. The package 402 includes further pins, such as clock and signal input pins RAS*, CAS*, WE* and CS*, that are connected to corresponding clock chip bond pads 350b, and power pins, such as power pins VCC, VSS, VSSQ and VCCQ, that are connected to corresponding power chip bond pads.

In this arrangement, all of the address chip bond pads are located in one row which is closest to the address pins. Also, all of the data chip bond pads are located in the row that is closest to the input/output pins.

Figure 5:
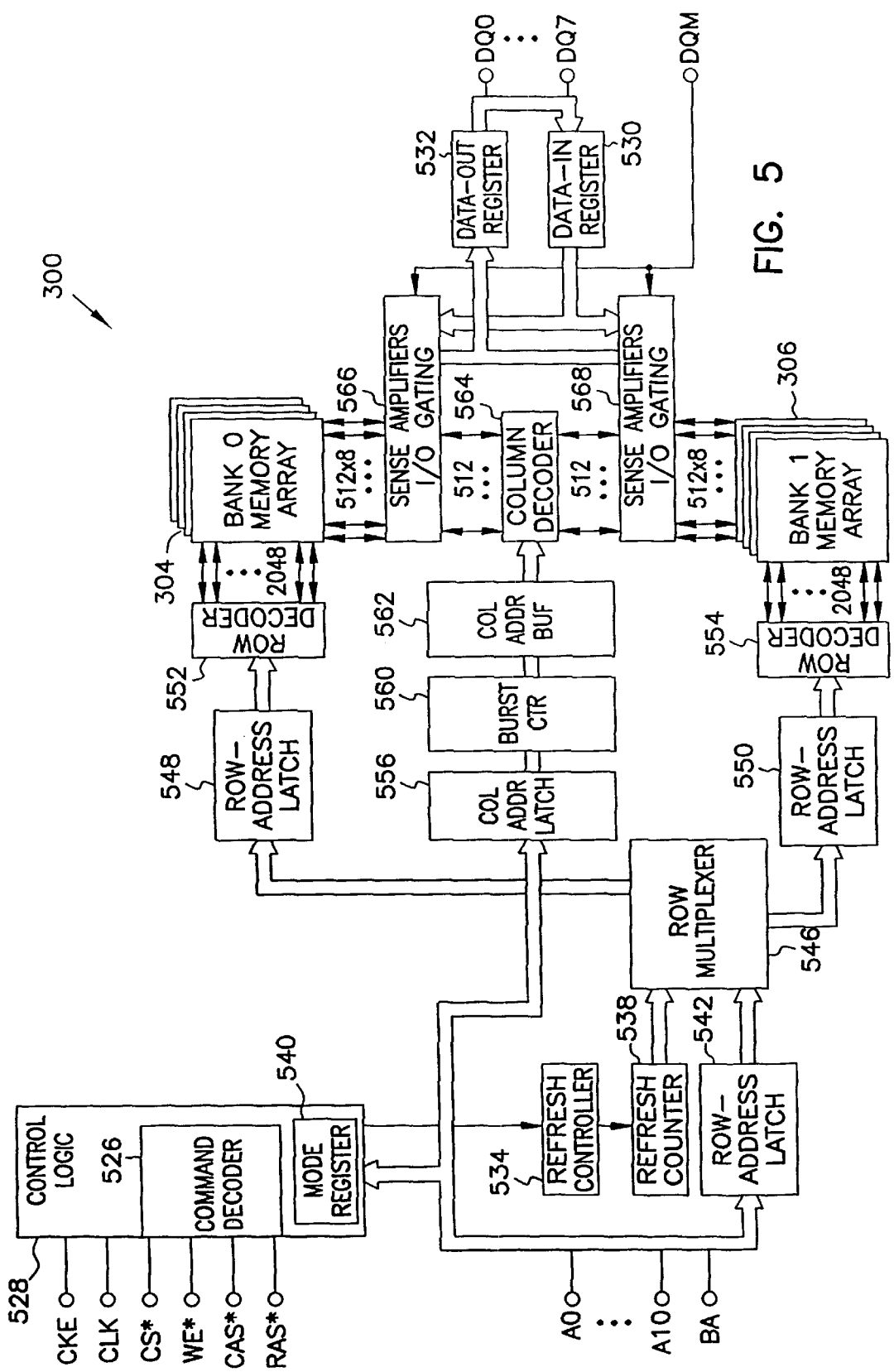
FIG. 5 is a functional block diagram of the synchronous dynamic random access memory of FIG. 3 which incorporates the package orientation and architecture in accordance with the invention.

FIG. 5 is a functional block diagram of one embodiment of the example SDRAM device 300 organized as a dual 8 Meg×8 memory which includes a synchronous interface. Each of the 8 Meg banks is organized as 2048 rows by 512 columns by eight bits. Much of the circuitry of the SDRAM device 300 is similar to circuitry in known SDRAMs, such as the MT48LC2M8A1 S 2 Meg×8 SDRAM, which is commercially available from Micron Technology, Inc. Boise Id., 83707, and which is described in detail in the corresponding Micron Technology, Inc., Functional Specification which is incorporated herein by reference.

SDRAM device 300 includes bank 0 memory array 304 and a bank 1 memory array 306 which both comprise storage cells organized in rows and columns for storing data In one embodiment of the SDRAM device 300, each bank memory array comprises eight separate arrays of 2048 rows×512 columns.

A system clock (CLK) signal is provided through a CLK input pin and a clock enable signal (CKE) is provided through a CKE input pin to SDRAM device 300. The CLK signal is activated and deactivated based on the state of the CKE signal. All the input and output signals of SDRAM device 300, with the exception of the CKE input signal during power down and self refresh modes, are synchronized to the active going edge of the CLK signal.

A chip select (CS*) input pin inputs a CS* signal which enables, when low, and disables, when high, a command decode 526. Command decode 526 is included in control logic 528. Command decoder 526 receives control signals including a row address strobe (RAS*) signal on a RAS* pin, column address strobe (CAS*) signal on a CAS* pin, and a write enable (WE*) signal on a WE* pin. Command decoder 526 decodes the RAS*, CAS*, and WE* signals to place control logic 528 in a particular command operation sequence. Control logic 528 controls the various circuitry of SDRAM device 300 based on decoded commands, such as during controlled reads to or writes from bank 0 memory array 304 and bank 1 memory array 306. A bank address (BA) signal is provided on a BA input pin to define which bank memory array should be operated on by certain commands issued by control logic 528.

Address inputs bits are provided on input pins A0–A10. As described below, both the row and column address input bits are provided on the address input pins. During write transfer operations, data is supplied to SDRAM device 300 via input/output pins (DQ0–DQ7). During read transfer operations, data is clocked out of SDRAM device 300 via input/output pins DQ0–DQ7. An input/output mask signal is provided on a DQM input pin to provide control for a data input register 530 and data output register 532, which corresponds to data output register 316 (FIG. 3).

Power-up and initialization functions of the SDRAM device 300 are conducted in the conventional manner. Moreover, refresh functions of the SDRAM device 300 are provided in the known manner employing a refresh controller 534 and a refresh counter 538 to refresh the memory arrays.

A valid ACTIVE command is initiated by control logic 528 with the CS* and RAS* signals low and with the CAS* and WE* signals high on a rising edge of the CLK signal. During the ACTIVE command the state of the BA signal determines which bank memory array to activate and address. During the ACTIVE command, a value representing a row address of the selected bank memory array, as indicated by address bits on input pins A0–A10, is latched in a row address latch 542. The latched row address is provided to a row multiplexer 546 which provides a row address to row address latch 548 to be provided to bank 0 memory array 304 or row address latch 550 to be provided to bank 1 memory array 306, depending on the state of the BA signal. A row decoder 552 decodes the row address provided from row address latch 548 to activate one of the 2,048 lines corresponding to the row address for read or write transfer operations, to thereby activate the corresponding row of storage cells in bank 0 memory array 304. Row decoder 554 similarly decodes the row address in row address latch 550 to activate one of the 2,048 lines to bank 1 memory array 306 corresponding to the row address for read or write transfer operations, to thereby activate the corresponding row of storage cells in bank 1 memory array 306. The row decoder circuits 311–313 (FIG. 3) comprise the row address latch 542, the row multiplexer 546, the row address latch 548, the row address latch 550, the row decoder 552, the row decoder 554.

A valid READ command is initiated with the CS* and CAS* signals low, and the RAS* and WE* signals high on a rising edge of the CLK signal. The READ command from control logic 528 controls a column address latch 556 which receives address bits A0–A9 and holds a value representing a column address of the bank memory array selected by the BA signal at the time the READ command is initiated. Address pin A10 provides an input path for a command signal which determines whether or not an AUTO-PRECHARGE command is to be initiated automatically after the READ command as is known in the art. The READ command provided from control logic 528 also initiates a burst read cycle by starting a burst counter 560 in the manner known in the art.

A column address buffer 562 receives the output of the burst counter 560 to provide the cent count of the column address to a column decoder 564. The column decoder 314 (FIG. 3) comprises the column address latch 556, the burst counter 560, the column address buffer 562 and the column decoder 564. Column decoder 564 activates eight of the 512×8 lines, provided to sense amplifiers and input/output (I/O) gating circuit 566 (which include helper flip flops 315 for memory array 304 shown in FIG. 3) and sense amplifiers and I/O gating circuit 568 (which include helper flip flops 315 for memory array 306 shown in FIG. 3) corresponding to the current column address. Sense amplifiers and I/O gating circuits 566 and 568 operate in a manner known in the art to sense the data stored in the storage cells addressed by the active row decoder line and the active column decoder lines to provide the selected eight bit byte of data from either bank 0 memory array 304 or bank 1 memory array 306 respectively to data output register 532 during a read operation. Data output register 532 provides the selected eight bit byte of data to input/output data outputs at lines DQ0–DQ7.

A valid WRITE command is initiated with the CS*, CAS*, and WE* signals low and the RAS* signal high on the rising edge of the CLK signal. The WRITE command provided from command controller 528 clocks column address latch 56 to receive and hold a value representing a column address of the bank memory array selected by the state of the BA signal at the time the WRITE command is initiated, as indicated by the address provided on address inputs A0–A9. As with the read operation, during the WRITE command, address pin A10 provides the additional feature to select whether or not the AUTO-PRECHARGE command is to be initiated following the WRITE command. Burst counter 560 initiates the burst write cycle. Column address buffer 562 receives the output of the burst counter 560 and provides the current column address to column decoder 564. Column decoder 564 activates eight of the 512×8 lines to sense amplifiers and I/O gating circuits 66 and 68 corresponding to the column address to indicate where the incoming eight bit byte of data is to be stored in either bank 0 memory array 304 or bank 1 memory array 306.

During WRITE command operations, data is provided on input/output pins DQ0–DQ7 to data-in register 530. The eight bit byte of input write data is provided to the selected bank memory array with sense amplifiers and I/O gating circuits 566 or 568 in a manner known in the art based on the activated eight lines corresponding to the current column address.

Thus, it has been shown that the invention provides an architecture and package orientation for semiconductor memory devices, such as dual bank, synchronous dynamic random access memory devices, for increasing operating speed of such memory devices. The memory chip on which the memory device is fabricated is oriented lengthwise in the package which allows the data outputs of the memory device to be segmented and allows the length of the data read/write lines to be minimized. Also, the column decoders of the memory device are located within the memory array with the column select lines extending outwardly toward opposite edges of the memory array so that the column select lines is one-half the length of the column select lines of conventional memory devices. Moreover, the chip bond pads of the memory device are located between the memory banks of the dual bank memory device, with the address chip bond pads are disposed in a common row and with all of the data chip bond pads disposed in a different common row.

What is claimed is:

1. A semiconductor memory chip comprising:
   a substrate;
   a first memory bank fabricated on the substrate;
   a second memory bank fabricated on the substrate, spaced apart from the first memory bank defining a chip bond pad region for the memory chip;
   a data output register fabricated on the substrate in the chip bond pad region between the first and second memory banks;
   a plurality of chip bond pads located in the chip bond pad region between the first and second memory banks and adjacent to the data output register;
   a first plurality of data read/write lines extending from the first memory bank to the data output register; and
   a second plurality of data read/write lines extending from the second memory bank to the data output register.

2. The memory chip according to claim 1, including a first row of chip bond pads extending between first and second sides of the chip, and a second row of chip bond pads extending between the first and second sides of the chip, and wherein all of the address inputs of the device are connected to chip bond pads in said first row of chip bond pads, and wherein all of the data inputs/outputs of the memory are connected to chip bond pads located in said second row of chip bond pads.

3. The memory chip according to claim 2, wherein the first row of chip bond pads extend in parallel with the second row of chip bond pads between the first and second memory banks.

4. A semiconductor memory chip comprising:
   a substrate;
   a first memory bank fabricated on the substrate;
   a first column decoder located within the first memory bank;
   a second memory bank fabricated on the substrate, spaced apart from the first memory bank defining a chip bond pad region for the memory chip;
   a second column decoder located within the second memory bank;
   a data output register fabricated on the substrate in the chip bond pad region between the first and second memory banks;
   a plurality of chip bond pads located in the chip bond pad region between the first and second memory banks and adjacent to the data output register;
   a first plurality of data read/write lines extending from the first memory bank to the data output register; and
   a second plurality of data read/write lines extending from the second memory bank to the data output register.

5. The memory chip according to claim 4, including a first row of chip bond pads extending between first and second sides of the chip, and a second row of chip bond pads extending between the first and second sides of the chip, and wherein all of the address inputs of the device are connected to chip bond pads in said first row of chip bond pads, and wherein all of the data inputs/outputs of the memory are connected to chip bond pads located in said second row of chip bond pads.

6. The memory chip according to claim 5, wherein the first row of chip bond pads extend in parallel with the second row of chip bond pads between the first and second memory banks.

7. A semiconductor memory chip comprising:
   a substrate;
   a pair of memory banks fabricated on the substrate defining a chip bond pad region between the pair of memory banks, wherein at least one of the banks comprises:
      a first group of sub-arrays;
      a second group of sub-arrays;
      a column decoder interposed between the first and second group of sub-arrays;
   a data output register fabricated on the substrate in the chip bond pad region between the first and second memory banks;
   a plurality of chip bond pads located in the chip bond pad region between the first and second memory banks and adjacent to the data output register;
   a first plurality of data read/write lines extending from the first memory bank to the data output register; and
   a second plurality of data read/write lines extending from the second memory bank to the data output register.

8. The memory chip according to claim 7, including a first row of chip bond pads extending between first and second sides of the chip, and a second row of chip bond pads extending between the first and second sides of the chip, and wherein all of the address inputs of the device are connected to chip bond pads in said first row of chip bond pads, and wherein all of the data inputs/outputs of the memory are connected to chip bond pads located in said second row of chip bond pads.

9. The memory chip according to claim 8, wherein the first row of chip bond pads extend in parallel with the second row of chip bond pads between the first and second memory banks.

10. An integrated circuit assembly comprising:
an elongated memory chip, the memory chip having a major axis and a minor axis, the chip comprising:
- a substrate;
- a first memory bank fabricated on the substrate;
- a second memory bank fabricated on the substrate, spaced apart from the first memory bank defining a chip bond pad region for the memory chip;
- a data output register fabricated on the substrate in the chip bond pad region between the first and second memory banks;
- a plurality of chip bond pads located in the chip bond pad region between the first and second memory banks and adjacent to the data output register;
- a first plurality of data read/write lines extending from the first memory bank to the data output register;
- a second plurality of data read/write lines extending from the second memory bank to the data output register; and an elongated package for mounting the memory chip, the package having a major axis and a minor axis, and a plurality of pins, wherein the memory chip is oriented with its major axis extending along the minor axis of the package, and the plurality of chip bond pads are connected to thee plurality of pins.

11. The integrated circuit assembly of claim 10, wherein the plurality of pins comprises a plurality of data pins and a plurality of address pins.

12. The integrated circuit assembly of claim 11, wherein the plurality of chip bond pads includes a first row of chip bond pads extending between first and second sides of the chip, and a second row of chip bond pads extending between the first and second sides of the chip, and wherein all of the address pins are connected to chip bond pads in said first row of chip bond pads, and wherein all of the data pins are connected to chip bond pads located in said second row of chip bond pads.

13. The integrated circuit assembly of claim 12, wherein the first row of chip bond pads extend in parallel with the second row of chip bond pads between the first and second memory banks.

* * * * *